United States Patent
Kim

[11] Patent Number: 5,548,884
[45] Date of Patent: Aug. 27, 1996

[54] METHOD OF MANUFACTURING A KNOWN GOOD DIE ARRAY

[75] Inventor: Il U. Kim, Seoul, Rep. of Korea

[73] Assignee: Samsung Electronics Co., Ltd., Kyungki-do, Rep. of Korea

[21] Appl. No.: 224,020

[22] Filed: Apr. 7, 1994

[30] Foreign Application Priority Data

Apr. 7, 1993 [KR] Rep. of Korea ............... 1993-5769

[51] Int. Cl.⁶ ............... H05K 3/34; H01R 43/04; H01R 43/00
[52] U.S. Cl. ............... 29/593; 29/882; 29/884; 83/942; 324/765; 437/183
[58] Field of Search ............... 29/593, 874, 882, 29/884; 83/942; 324/765; 437/183

[56] References Cited

U.S. PATENT DOCUMENTS 3,444,619  5/1969  Loherson ............... 29/884
5,006,792  4/1991  Malhi et al. .

OTHER PUBLICATIONS

Tim Corbett, "A Process Qualification Plan For KGD" ICEMM Proceedings '93 166–188.
Marshall Andrews, "Known Good Die", Microelectronics And Computer Technology Corporation, Oct. 1992.

Primary Examiner—P. W. Echols
Attorney, Agent, or Firm—Cushman Darby & Cushman, L.L.P.

[57] ABSTRACT

A known good die array is obtained by a general semiconductor assembly technique to enable mass production of known good die by performing AC and burn-in tests upon a plurality of IC chips simultaneously. The IC chip is attached to the die pad of a lead frame by interposing an adhesive and is wire-bonded. The lead frame is electrically separated from the wire-bonded lead, and the resultant lead frame is inserted into a test jig to perform the AC and burn-in tests. Bonding wires are cut by a cutting apparatus with a diamond and/or a diamond-like blade to attach the plurality of known good die as arrays. The low-cost known good die can be produced in large quantities using ordinary IC chips and can be applied to personal computers beyond the current application field of multichip modules used in super computers.

12 Claims, 3 Drawing Sheets

METHOD OF MANUFACTURING A KNOWN GOOD DIE ARRAY

BACKGROUND OF THE INVENTION

1. Field of the Invention

The present invention relates to a known good die array (hereinafter referred to as a "KGD" array) and manufacturing method thereof, and more particularly to a KGD array and manufacturing method thereof, wherein a plurality of integrated circuit chips (hereinafter referred to as "IC chips"), which are separated from a wafer are simultaneously subjected to an alternating current (AC) or burn-in test, thereby enabling mass production of KGD arrays without defects.

2. Description of the Prior Art

It is known that IC chips are essentially subjected to an AC test or burn-in test during the manufacture of semiconductor devices for the purpose of finding defective IC chips. However, bare IC chips cannot be connected to a test pattern generating circuit, and thus, the AC test or burn-in test cannot be performed. Therefore, as shown in FIG. 1, the general AC test and burn-in test are carried out when packaged by molding the IC chip by a molding process using an epoxy molding compound ("EMC").

Referring to FIG. 1, external leads 12 connected to chip pads (not shown) project along sidewalls of a package 10. A test socket 15 for mounting the package 10 has a plurality of receptacles 14 to receive the external leads 12. Rigid leads 16 externally project from the lower portion of the receptacles 14.

The package 10 having the projecting external leads 12 is mounted in the receptacles 14 of the test socket 15. The test socket 15 is fixed to a burn-in-board which is not shown. Thus, the AC test and burn-in test are performed while the package 10 is mounted in the test socket 15.

During the AC test and the burn-in test, the IC chip is supplied with test signals at elevated temperatures or at voltage levels higher than that used for normal operation. Then, a check is conducted to determine if defects appear in any IC chip when being supplied with the test signal. For example, in a DRAM, defective storage circuits, defective storage cells and defective connection lines could be checked.

Defects such as a breakdown of an insulating layer due to a gate oxide defect, which sometimes appear in IC chips are likely to cause a failure of the chip when used under normal conditions. Therefore, such a defect in an IC chip can be detected by performing the burn-in test, and can be treated as an inferior product. As described above, the defective IC chip is rejected before being sold in the market, thereby guaranteeing reliability of the product stream.

However, since a packaged semiconductor chip is subjected to a burn-in test, once the chip is found to be defective, it cannot be used.

For this reason, instead of utilizing a single chip package, a multi-chip technique has been recently proposed which uses a flip chip for thermally mounting a plurality of bare chips on a ceramic board. The multichip technique includes various integration methods enabling large-scale integration while achieving high speed, high capacity and small size. One representative method among these is an integration method using a multichip module.

The multichip module attains very large scale integration in such a manner that a plurality of IC chips are commonly-connected to a multi-layered ceramic or plastic board having densely-arranged interconnections on the lower portion thereof. Currently, the multichip module is successfully used in super computers, etc., by companies such as IBM, DEC ad Hitachi.

Despite this advantage, the multichip module is technically and economically limited because of the following reasons. As compared with the single chip package technique, the multichip module having a plurality of IC chips has an increased integration scale but the production yield is significantly decreased thereby greatly increasing the manufacturing cost. Because of this, the multichip module has had difficulty in securing a sufficient market. The most difficult problem of the multichip module is to acquire sufficient KGD (i.e., IC chips which are not packaged but which have proved to be reliable after completing testing at the same level as the conventional package technique), which directly relates to the production yield.

The present invention is directed to acquiring sufficient KGD at low cost. Hereinafter, bare IC chips which prove to have no defects after being subjected to all tests will be referred as KGD. The bare chip denotes a common IC chip which is not packaged after being separated from the wafer as a single chip, such as, a flip chip, wire chip, etc. The more detailed concept of the KGD is described in a technical disclosure titled "Potential Project Report", published in October 1992 by Microelectronic and Computer Technology Corporation of Austin, Tex.

Even though the importance of KGD for use in the multichip module has been heightened, the mass production of low-priced KGD is very difficult. In more detail, a single bare chip separated from the wafer has no external leads for use in a test socket for testing the chips. Consequently, the AC test and burn-in test cannot be carried out before the IC chip is installed on a circuit board in the bare chip condition.

As a technique for solving this problem, a flip chip test socket adapter has been proposed which allows for the AC test and burn-in test in the bare chip state. The flip chip socket provides a solder bump to each electrode pad of the chip. This technique is disclosed in U.S. Pat. No. 5,006,792, and illustrated in FIGS. 2 and 3.

FIG. 2 is a perspective view showing a conventional flip chip having solder bumps 24. FIG. 3 is a sectional view showing the flip chip of FIG. 2 mounted to the test socket adapter. Referring to FIG. 2, an IC chip 22 includes a bonding pad having a plurality of solder bumps 24 thereon. The IC chip 22 is inserted into its own test socket adapter which will be described with reference to FIG. 3, and then tested.

Referring to FIG. 3, the test socket adapter 20 includes a substrate 28 having cantilever beams 26 correspondingly connected to the solder bumps 24 of the inserted IC chip 22. A reference numeral 23 denotes a lead connected to the cantilever beam 26. A lead 23 projects to the outside of the case 20, and a guide bar 25 stably supports the IC chip 22 when the IC chip 22 is inserted into the adaptor.

Tests of the IC chip using the test socket adapter according to the above description allows for testing under the bare chip state prior to being packaged.

In the conventional technique, the individual IC chip is separated from the wafer, and the chip test and burn-in test must be performed in the bare chip state while the solder bump 24 which is a metal projection is formed for each electrode pad of the IC chip 22. But an expensive apparatus requiring high precision is necessary during the formation of the bump on the electrode pad of the signal IC chip due to a fine pitch between the electrode pads in chips.

Another problem is that the chip should be individually handled during the test which makes chip handling difficult.

The problems in manufacturing KGD according to conventional techniques may be summarized as follows:

(1) Since the ordinary IC chip cannot be subjected to the AC test and burn-in test, resulting solder bumps must be formed and the chip placed in its own test socket so that the resulting products are provided in small quantity.

(2) Each IC chip is individually handled which makes chip handling difficult.

(3) KGD is considerably more expensive when compared with the packaged IC chip.

(4) It is difficult to form a test jig.

(5) There is no standardized IC chip size having standardized die pad locations.

SUMMARY OF THE INVENTION

The present invention is designed to solve the above-described problems. Accordingly, it is an object of the present invention to provide a KGD array and manufacturing method thereof capable of performing AC and burn-in tests upon common individual chips, without needing to form solder bumps thereon.

It is another object of the present invention to provide a KGD array and manufacturing method therefor capable of performing AC and burn-in tests upon a plurality of IC chips simultaneously.

It is yet another object of the present invention to provide a KGD array and manufacturing method thereof capable of performing AC and burn-in tests with an apparatus used for a typical IC assembly.

To achieve the above objectives of the present invention, a known good die array includes a lead frame which has a plurality of regularly-arranged die pads supported by tie bars. An adhesive is applied over respective die pads of the lead frame, and a plurality of known good dies with no defects are attached as individual dice on each die pad coated with the adhesive. These are then subjected to a final test.

To achieve another object of the present invention, there is provided a method for manufacturing a known good die array including the steps of:

preparing a lead frame having a plurality of leads and a plurality of regularly-arranged die pads supported by tie bars;

adhering an adhesive tape for fixing the die pads on the leads of the lead frame;

die attaching IC chips having a plurality of electrode pads separated from a wafer on respective die pads of the lead frame by interposing an adhesive;

wire bonding the electrode pads of the lead frame to the IC chips at the ends of respective leads;

performing a trimming for electrically separating the lead frame from the wire-bonded leads;

carrying out AC and burn-in tests by inserting the resultant lead frame to a test jig;

checking defective IC chips after completing the AC and the burn-in tests; and cutting the upper portions of the bonded wire balls, using a cutting device.

BRIEF DESCRIPTION OF THE DRAWINGS

The above objects and other advantages of the present invention will become more apparent by the following detailed description of the preferred embodiments thereof with reference to the attached drawings in which.

DETAILED DESCRIPTION OF THE PREFERRED EMBODIMENTS

Figure 1:
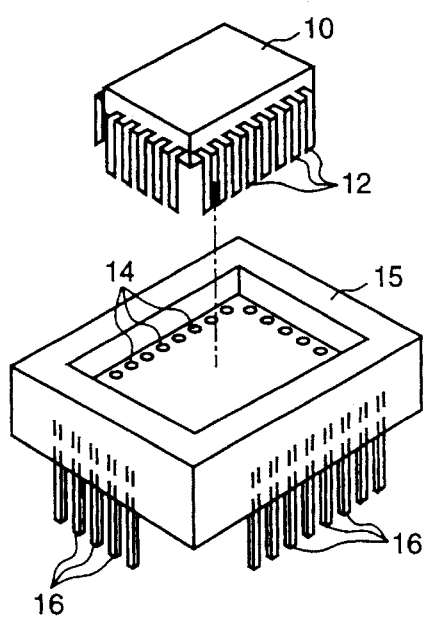
FIG. 1 is a perspective view showing a test socket according to a conventional technique.
Figure 2:
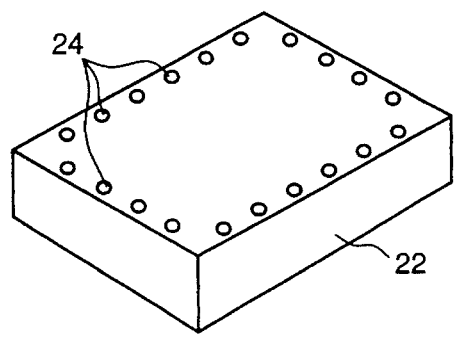
FIG. 2 is a perspective view showing a flip chip having solder bumps according to a conventional technique.
Figure 3:
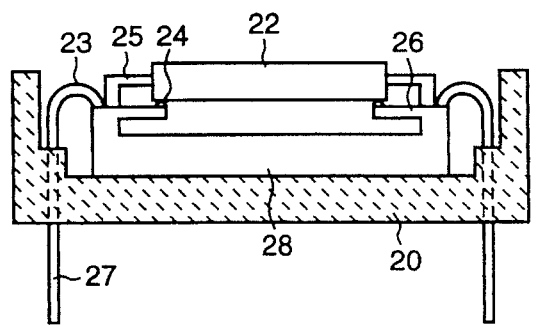
FIG. 3 is a sectional view showing the flip chip of FIG. 2 mounted to a test socket adapter.
Figure 4:
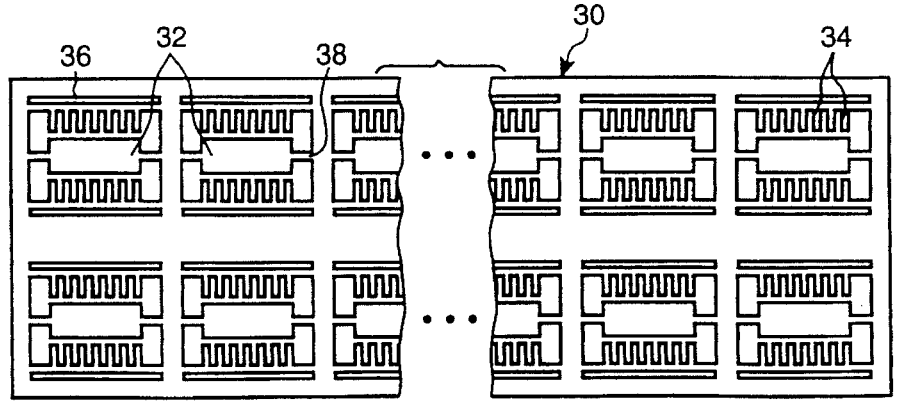
FIG. 4 is a plan view showing a lead frame utilized in manufacturing a KGD array according to a preferred embodiment of the present invention.

FIG. 4 shows a lead frame utilized in manufacturing a KGD array according to the preferred embodiment of the present invention, in which the lead frame is formed by a known technique, but to accommodate the structure of the present invention. Referring to FIG. 4, the lead frame 30 has regularly-arranged die pads 32 of the same size, and a plurality of leads 34 provided on both sides of the respective die pads 32. Since the lead frame 30 is not for a general IC chip package, a dam bar is not formed. At reference numeral 36 is an opening for preventing the deformation of the leads 34 during the trimming process. A tie bar 38 supports the die pad 32.

Figure 6:
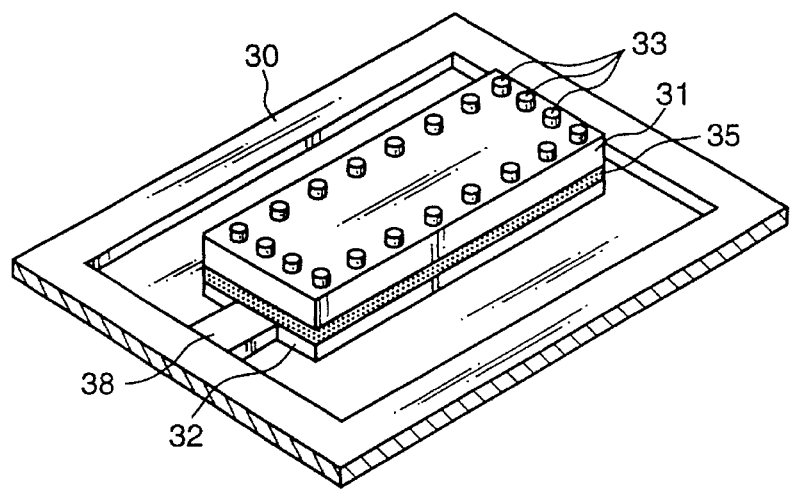
FIG. 6 is a perspective view showing an individual KGD of the KGD array according to the preferred embodiment of the present invention.

FIG. 6 is a perspective view showing an individual KGD of the KGD array according to a preferred embodiment of the present invention. The KGD array is provided after performing the overall AC and burn-in tests. The plurality of KGD are put on the lead frame 30 of FIG. 4 for wire-bonding the electrode pads of the IC chip 31 to the respective leads. For convenience, the structure of the KGD array will be described later and the manufacturing method thereof will first be described now.

Figure 5A:
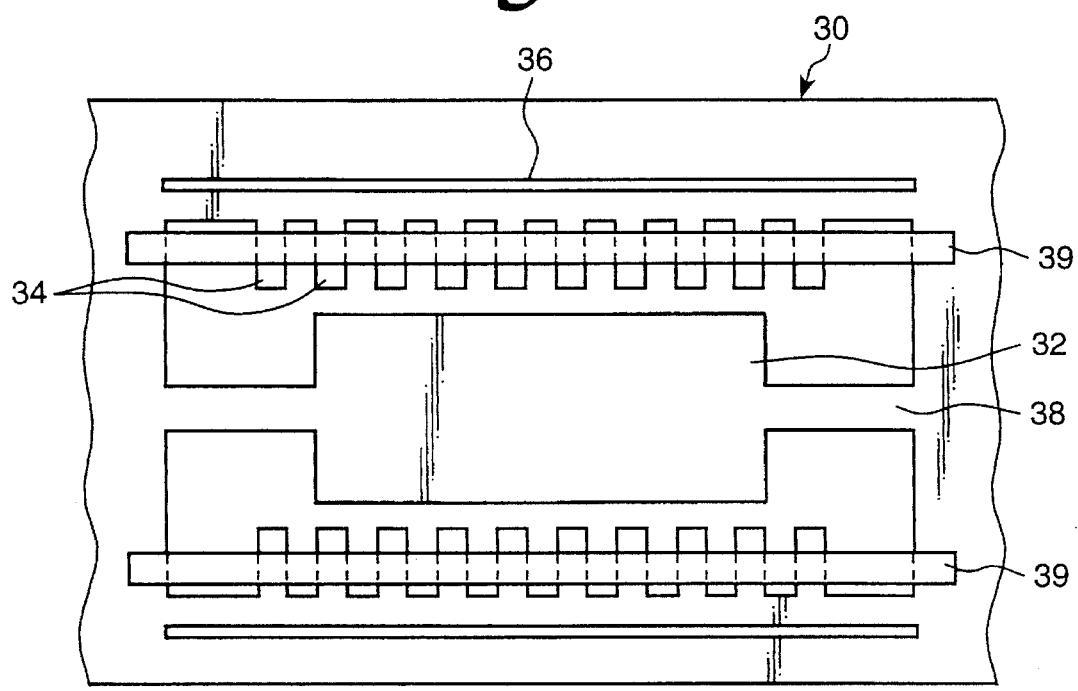
FIGS. 5A and 5B show a process for manufacturing the KGD array according to a preferred embodiment of the present invention.
Figure 5B:
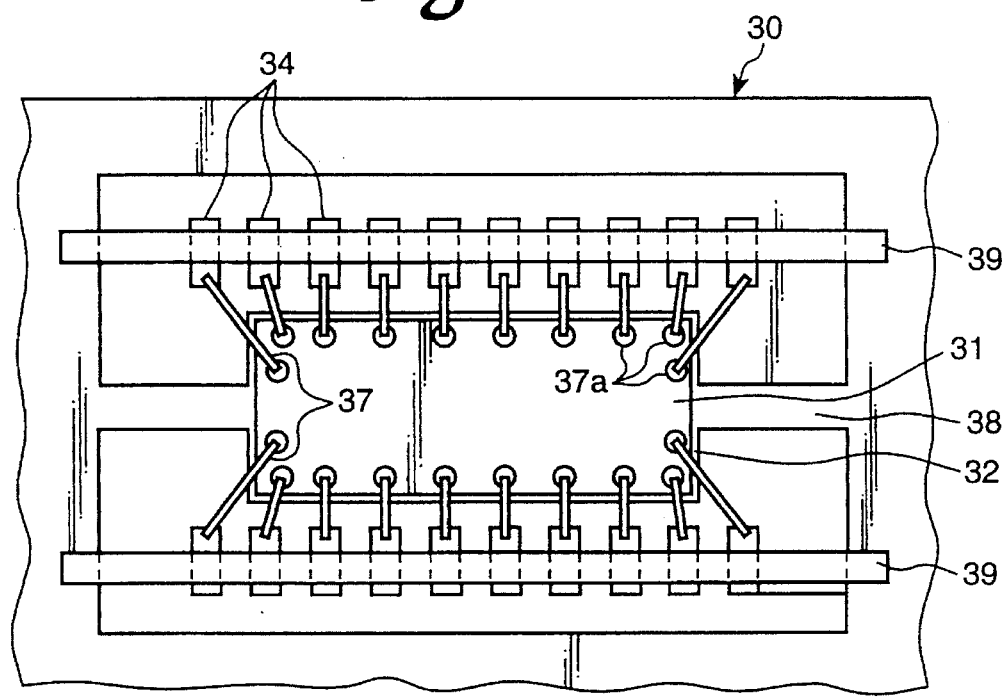

FIGS. 5A and 5B show a process for manufacturing the KGD array according to the preferred embodiment of the present invention. Referring to FIG. 5A, the lead frame 30 is formed by a known technique but with the frame design shown in FIG. 4. An adhesive tape 39 is attached for fixing the leads 34 of the lead frame 30. Here, the polyimide group having an excellent adhesion property is used with the adhesive tape 39.

Referring to FIG. 5B, the IC chip 31 as separated from the wafer has a plurality of electrode pads and is die-attached to the individual die pads 32 of the lead frame 30. For the die attachment, an electrically conductive die attaching adhesive incorporates conductive materials such as solder, thermosetting resins or thermoplastic resins, etc., in accordance with the purpose of its usage.

When a conductive material such as a solder is utilized, the solder in a proper amount is supplied to the die pad 32, and the IC chip is thermally pressed. The reason for using a conductive material, such as, the solder, is to allow for electrical current flow from the lead frame if the rear portion is employed as a ground portion, or to allow for the die pad attached on the lower surface of the separated KGD to serve as a heat sink. The epoxy resins and polyamic acids which are hardened by the polyimide may be used as a thermosetting resin.

When the KGD is desired without attaching the die pad on the bottom surface thereof, a thermoplastic resin including polyaryllen, polyether, polysulfon resins, or polyarylate resin may be used as the adhesive. At this time, because of flowage at a predetermined temperature, the KGD must be easily separated from the die pad.

After finishing the die attachment step, the respective electrode pads of the IC chip 31 and the ends of the leads 34 respectively corresponding to the electrode pads are wire-bonded via a thermal pressure method, using gold (Au). For a bonding wire 37, any material can be employed, e.g., aluminum and the like, which can be bonded to the aluminum electrode pad of the common IC chip 31 via an ultrasonic wave method Preferably, the bonding wire 37 is ball-bonded to a respective electrode pad of common IC chip 31, so as to form a conductive ball portion thereon.

After the wire bonding step, the trimming process is executed to electrically separate the lead frame 30 from the wire-bonded leads 34. The opening 36 facilitates the trimming process.

After the trimming process for lead isolation, the AC and burn-in tests are carried out. The general IC assembly process described heretofore, such as, the lead frame preparation, wire bonding and trimming to separate the leads electrically connected to the electrode pads of the IC chip is merely a series of steps, in order to execute the AC test and burn-in test.

Here, individual chips are not separately tested, but the overall lead frame 30 mounted with a plurality of arrays of the IC chips 31 wire-bonded to the leads 34 is tested at once.

A test jig suitable for testing the overall lead frame 30 with its array of mounted chips may be readily designed.

The electrode pads of each IC chip are connected to the corresponding leads 34 through the bonding wires 37. The leads 34 serve as test electrode pins, so that the test jig design is easier to make than the conventional test socket adapter design which requires the formation of fine bumps.

Using the test jig, about 16 IC chips 31 on the single lead frame 30 are tested at a time. By continuing the AC and burn-in tests, defective IC chips can be detected and treated as inferior products.

In the final step of the KGD array manufacturing method, which can be considered as the most important step in this new method of producing KGD, after completing the AC test and burn-in test, the bonding wires 37 for electrically connecting respective electrode pads of the IC chip 31 and the leads 34 corresponding to the electrode pads are cut. The bonding wire 37 for providing the test electrode pin during the AC test and burn-in test is eliminated, because it is not directly required for the KGD array according to the present invention. The bonding wire 37 for providing the test electrode pin during the AC test and burn-in test is eliminated, because it is not directly required for the KGD array according to the present invention.

Figure 7A:
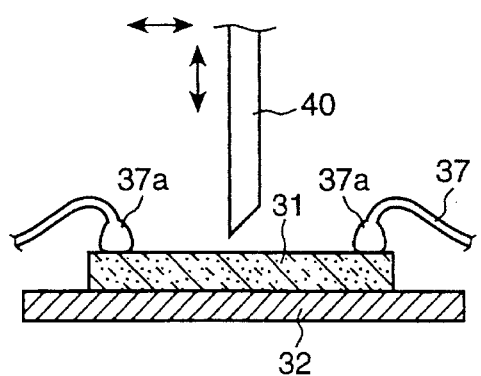
FIGS. 7A and 7B show the use of a cutting apparatus utilized in manufacturing the KGD array according to the preferred embodiment of the present invention.

For the cutting process of the bonding wire 37, a cutting apparatus 40 shown in FIG. 7A is employed. The cutting apparatus 40 is shaped as a chisel having a sharp blade on the edge thereof, in which a diamond is primarily used. There could be other materials for the blade, such as, tungsten carbide with a diamond coating, a sharpened steel blade and so on. The cutting apparatus 40 is fixed to an arm to be moved up and down by a precision stepping motor in which the tolerance is about 1 μm. Forward to backward and right to left directions can be also controlled by an X-Y traverse table with high precision.

FIG. 7A shows the cutting apparatus utilized in manufacturing the KGD array according to the preferred embodiment of the present invention. The important feature here is to cut the wire with a diamond blade after all required AC and burn-in tests. Referring to FIG. 7A, the cutting apparatus 40 is moved close to the central surface of the IC chip 31 which is attached and wire-bonded on the lead frame 30. Adjustment of the left to right direction to cut the upper portion of a wire ball 37a of the bonding wire 37 is arranged by an X-Y traverse table. For the purpose of precision control of the wire ball dimension, the lead frame should be fixed by a vacuum chuck on the X-Y traverse table.

Figure 7B:
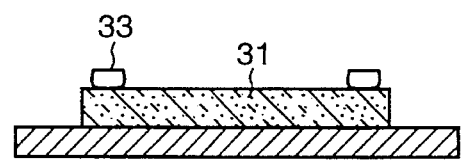

Referring to FIG. 7B, after cutting the bonding wire 37, only the cut wire ball 33 is left on the electrode pad of the IC chip 31. The cut wire ball 33 may be used as the bump. At this time, the shape and height of the bump are easily set by adjusting the descending height of the cutting apparatus 40.

The wire bonding can be repeatedly performed on the upper surface of the cut wire ball 33 to enable bumps to be formed several times on the bonding pad, as required. In order to confirm the reliability of the wire-bonded chip, the wire is cut and then bonded again to perform a pull test, which results in the same favorable data as the first bonding. Also, an experiment by this applicant presented the same data in tests repeated five times without any fault. After the cutting process of the bonding wire, the resultant structure is shown in FIG. 6, in which the bonding wires, adhesive tape and leads are eliminated, and the IC chips 31 with no defects, having been subjected to the AC test and burn-in test, are attached to the lead frame 30 by interposing an adhesive 35.

In the finally-obtained KGD array according to preferred embodiment of the present invention, the individual KGD shown in FIG. 6 are mounted to the lead frame 30 as a plurality of arrays. Several sheets of these lead frames 30 may be loaded on a currently-used lead frame magazine for sale in the market. Thus, the already-tested chips are packed in a cheap disposable magazine to be delivered to the end user. After cutting the tie bar, the plurality of IC chips delivered to the purchaser can be used as individual KGD by attaching the die pad on the lower surface thereof. The die pad can be utilized as the heat sink as mentioned above.

As in the foregoing description, the IC chip is not individually handled in the present invention, so that any defects which are liable to occur during handling the base chip can be minimized.

The effect of the KGD array and manufacturing method thereof according to the present invention is summarized as follows.

(1) KGD having been subjected to the AC and burn-in tests with no defects can be produced in large quantities, using ordinary IC chips.

(2) The tie bar can be cut after delivering the chips to the purchaser to facilitate handling the chips at the chip level.

(3) Since equipment used for the typical IC assembly are employed without needing to be changed, no additional equipment is required.

(4) The test jig is easily manufactured.

(5) Standardization can be achieved.

(6) In accordance with the end user's demand, the IC chips are easily classified into wire bonding, flip-chips and bumps.

(7) The cost of the KGD can be lowered remarkably to expand the application field of the multichip module or ASIC module from the currently applied super computers to personal computers.

As a result, in the KGD array and manufacturing method according to the present invention, at least one KGD is mounted to a lead frame as a plurality of arrays to obtain many KGDs which are tested simultaneously. Furthermore, the plurality of IC chips can be utilized as the individual KGD attached to the die pad on the bottom surface thereof by cutting the tie bar to effect various changes in form and detail of the present invention without departing from the spirit and scope of the invention as defined by the appended claims.

What is claimed is:

1. A method for manufacturing a known good die array, comprising the steps of:

providing a lead frame having a plurality of die pads supported on said lead frame by a corresponding tie bar, wherein each die pad is associated with a plurality of leads provided on said lead frame;

adhesively applying an adhesive tape to each said plurality of leads associated with each die pad of said lead frame;

mounting a plurality of semiconductor chips on respective die pads of said plurality of die pads using an adhesive interposed between each semiconductor chip and a respective die pad, wherein each semiconductor chip has a plurality of electrode pads provided thereon;

connecting electrode pads of each semiconductor chip to respective leads of said respective plurality of leads using wires, wherein each wire is ball-bonded to a respective electrode pad so as to form a conductive ball portion;

separating each plurality of leads associated with each respective die pad from said lead frame, whereby each said separated plurality of leads are fixed by said adhesive tape;

connecting said lead frame with said separated plurality of leads to a test jig;

testing said plurality of mounted semiconductor chips; and after said testing step, cutting each conductive ball portion on each semiconductor chip, whereby a portion of each conductive ball portion is left on each respective semiconductor ship.

2. The method as claimed in claim 1, wherein said cutting step is performed using a cutting tool.

3. The method as claimed in claim 2, wherein said cutting step includes a step of adjusting a cutting orientation of said cutting tool so as to control a height of each said cut conductive ball portion.

4. A method as claimed in claim 2, wherein said cutting step is performed using a cutting tool comprising a diamond blade.

5. The method as claimed in claim 1, wherein said testing step includes performing an AC test.

6. The method as claimed in claim 1, wherein said testing step includes performing a burn-in test.

7. The method as claimed in claim 1, further including, after said testing step, a step of identifying a semiconductor chip failing said testing step.

8. The method as claimed in claim 1, wherein a lead frame having at least 16 die pads is provided.

9. The method as claimed in claim 1, wherein said adhesive tape is a polyimide group adhesive.

10. A method as claimed in claim 1, wherein said mounting step includes using a conductive adhesive material to mount each semiconductor chip to a respective said die pad.

11. A method as claimed in claim 10, wherein said conductive adhesive material is one of solder, a conductive thermosetting resin, and a conductive thermoplastic resin.

12. A method as claimed in claim 1, further including, after said cutting step, a step of obtaining a plurality of known good dies by cutting each tie bar corresponding to each die pad of said plurality of die pads.

* * * * *